United States Patent [19]

Maeda et al.

[11] Patent Number: 4,561,891
[45] Date of Patent: Dec. 31, 1985

[54] POWDERY SILICON CARBIDE COMPOSITION FOR SINTERING

[75] Inventors: Kunihiro Maeda; Katsuhisa Usami; Yukio Takeda; Satoru Ogihara; Osamu Asai, all of Hitachi, Japan

[73] Assignee: Hitachi, Ltd., Tokyo, Japan

[21] Appl. No.: 538,816

[22] Filed: Oct. 5, 1983

[30] Foreign Application Priority Data

Oct. 6, 1982 [JP] Japan ................. 57-176851

[51] Int. Cl.[4] ............... C04B 35/56; C22C 29/00
[52] U.S. Cl. ........................ 75/238; 75/254; 501/88
[58] Field of Search .......... 501/88, 89, 92, 154; 428/446; 75/238, 252, 254, 255

[56] References Cited

U.S. PATENT DOCUMENTS 4,023,975  5/1977  Prochazka ..................... 106/44

FOREIGN PATENT DOCUMENTS 28802  5/1980  European Pat. Off. .

Primary Examiner—John F. Terapane
Assistant Examiner—Anne Brookes
Attorney, Agent, or Firm—Antonelli, Terry & Wands

[57] ABSTRACT

A sintered silicon carbide body having a high thermal conductivity and a high electrical insulation without any drop substantially throughout the sintered body is produced from a powdery silicon carbide composition comprising at least 90% by weight of silicon carbide powders having an average particle size of not more than 10 μm and 0.01 to 4% by weight of powders of beryllium or its compound having a particle size of not more than 30 μm in terms of beryllium atom, a nitrogen content of the composition being not more than 500 ppm.

4 Claims, 7 Drawing Figures (Aℓ + B - N) CONTENT (ppm)

POWDERY SILICON CARBIDE COMPOSITION FOR SINTERING

BACKGROUND OF THE INVENTION

This invention relates to a novel powdery silicon carbide composition for producing sintered silicon carbide having a high thermal conductivity, a high density and a high electrical insulation, and particularly to a novel powdery composition comprising silicon carbide as the main component capable of producing a sintered body having a high thermal conductivity without any drop in electrical insulation substantially throughout the sintered body and also to a sintered silicon carbide produced from such composition.

The sintered body produced from the present powdery composition has a high thermal conductivity, a high electrical insulation and a high density, and is useful for substrates of semiconductor integrated circuit devices, etc., other electronic materials, insulating materials, mechanical parts and structural materials utilizing a high thermal conductivity, etc.

Owing to the recent remarkable development of the semiconductor industry, insulating substrates for use in large scale integrated circuits, etc. must carry circuit elements at a higher loading density, and also a demand for miniturization of these devices has been very keen, and materials having a high thermal conductivity, that is, materials having a function to efficiently dissipate the heat generated in the circuits has been needed for the insulating substrates.

Materials now widely utilized for the insulating substrates in the semi-conductor industry are sintered alumina, which has a good electrical insulation, but is quite unsatisfactory in the thermal conductivity. Also the thermal expansion coefficient of alumina is higher than those of semiconductor materials, particularly silicon.

A low thermal conductivity means that the loading density and capacity of integrated circuit devices are limited and to increase heat dissipation it is necessary to take some measures of using thinner alumina substrates and fixing a heat sink material or fins thereto. On the other hand, a high thermal expansion coefficient means that a semi-conductor wafer or chip cannot be directly connected to a circuit pattern formed on the substrate, and generally it is necessary to provide a wafer or chip on the substrate through a buffer material such as a molybdenum plate or a tungsten plate, or through an electrode material.

By taking the said measures, not only integrated circuit devices are complicated and expensive, but also a thermal resistance between the semiconductor element and the alumina substrate or the heat sink material is increased, limiting the loading density.

Japanese Patent Applications Kokai Nos. 56-66086, 57-2591, etc. disclose high density sintered bodies produced from silicon carbide as the main component and beryllium or beryllium compound as a sintering aid by sintering. These sintered bodies are quite different from the sintered alumina, because the former has a high thermal conductivity and a low thermal expansion coefficient while maintaining a high electrical resistivity. It can be said from these three remarkable properties that the sintered silicon carbide has properties of metallic material with respect to a high thermal conductivity and of ceramics with a high electrical insulation and a low thermal expansion coefficient at the same time.

The present inventors have produced and tested sintered silicon carbide-beryllium bodies of said new type and have found surprising facts. That is, the present inventors mixed fine silicon carbide powder and beryllia powder, then kneaded the mixture in the presence of an organic binder, prepressed the mixture under pressure to obtain green bodies having a relative density of 50–53% on the basis of the theoretical density of the powder mixture, and then sintered the green bodies at 2,050°–2,100° C. under a pressure of about 300 kg/cm$^2$. The present inventors have found that, so far as the thickness of the sintered bodies is small, the sintered bodies can have a high electrical resistance substantially throughout the sintered bodies, that is, even at the peripheral part or surface part and at the inside part or interior part, whereas the thickness is higher, the electrical resistance of sintered bodies drops at the inside part or interior part.

Low electrical resistance at the inside part or interior part of sintered bodies is not suitable for substrates for semi-conductor devices, particularly for high voltage or large current applications, because it is a cause for leak current through the substrates.

The present inventors have studied the causes for the said phenomenon, and have found that the nitrogen content of silicon carbide powders takes part in such a phenomenon.

A very small portion of beryllium in sintered silicon carbide having a substantial electrical insulation enters into grains of sintered body and works as an electron acceptor, whereas the most remaining portion thereof deposits between grains of silicon carbide as secondary phase in the form of a beryllium compound such as beryllium oxide, beryllium carbide, etc. and plays a role as a sintering aid in the sintering process.

On the other hand, no such secondary phase is observed at the grain boundaries of silicon carbide. However, the beryllium content is slightly increased, as compared with that in the grains, and it has been found by electron-microscopic observation that lattice image at the grain boundary is slightly deformed. Thus, it seems that carrier traps with various energy levels are formed in the grain boundary, and some of carriers in grains are captured by the traps, so that depletion layers are formed in contact with the grain boundary surfaces in grains adjacent to the grain boundary as electric barriers which causes an increase of the electrical insulation of the silicon carbide ceramics.

If a content of nitrogen which behaves as an electron donor in the SiC grains increases, the grains of sintered body turn into n-type semiconductor, which reduces the height of the electric barriers and depletion at the grain boundaries and lowers the electrical insulation of the sintered body.

A sintered body may contain aluminum, boron, or their compounds as impurities or as a sintering aid, and all of these elements are electron acceptors like beryllium in the SiC grains. When the proportion of the amount of nitrogen atoms to that of these electron acceptor elements other than beryllium is increased, the grains with p-type conduction turn into n-type, so that the drop in electrical insulation takes place.

The present inventors have further found that the degree of reducing the height of the electric barrier at the grain boundaries by an excessively high nitrogen content is increased with increasing thickness of sintered bodies.

SUMMARY OF THE INVENTION

The object of the present invention is to provide a powdery silicon carbide composition for producing sintered silicon carbide-beryllium having no drop in electrical insulation at the inside or interior side thereof, and also a sintered body produced therefrom.

The present invention provides a powdery silicon carbide composition for sintering, which comprises fine silicon carbide powders as the main component and powder of beryllium or beryllium compound, a nitrogen content of the composition being not more than 500 ppm, particularly not more than 350 ppm.

(1) Powder of beryllium or its compound

Powder of beryllium metal or its compound is added to silicon carbide powder in an amount of 0.01–4% by weight, preferably 0.5–3.5% by weight in terms of beryllium atom on the basis of total powder composition. The beryllium compound includes, for example, $BeO$, $Be(OH)_2$, $Be(NO_3)_2$, $BeSO_4$, $BeSO_4.2NH_3$, $Be(HCO_2)_2$, $Be_4O(HCO_2)_6$, $BeC_2H_4$, $Be_4O(CH_3CO_2)_6$, $BeH_4(PO_4)_2$, $BeHPO_4$, $Be_2P_2O_7$, $(NH_4)_2O.BeO.2C_2O_3$, $(NH_4)_2.Be(SO_4)_2$, $Be_3N_2$, $Be_2C$, etc. These compounds except $BeO$ and $Be_2C$ are wholly or partly decomposed to beryllia during the sintering of the composition, or react with SiC or free carbon to form beryllium carbide. These compounds can contain water of crystallization and also can be used in a mixture of at least two thereof.

The beryllium component serves as a sintering aid for silicon carbide powder and also works to make a sintered body into an insulator at the same time. The beryllium component must be pulverized to an average particle size of not more than 30 $\mu m$ so that it can be dispersed into silicon carbide powder as uniformly as possible.

(2) Silicon carbide powder

Finer silicon carbide powder has better sintering susceptibility and thus the particle size is adjusted to an average particle size of not more than 10 $\mu m$, preferably not more than 5 $\mu m$.

Silicon carbide powder of $\alpha$-type or $\beta$-type crystal structure can be used alone or as a mixture thereof in the present invention. However, $\alpha$-type silicon carbide undergoes no phase transformation during the sintering, and thus can be more easily sintered than $\beta$-type silicon carbide powder.

The main impurities in silicon carbide include free carbon, silicon dioxide, and free silicon. Other impurities include boron, magnesium, aluminum, calcium, titanium, vanadium, chromium, manganese, iron, cobalt, nickel, copper, zinc, sodium, potassium, zirconium, etc. Among these impurities, not more than 0.5% by weight of free carbon, not more than 4% by weight of silicon dioxide and not more than 1% by weight of free silicon are contained in silicon carbide powder. It has not been clarified yet whether these free carbon, silicon dioxide and free silicon are harmful or effective for sintered bodies.

Among other impurities, iron and titanium are contained in a relatively high content, such as about 50–5,000 ppm, aluminum mostly in a content of not more than 1,000 ppm, and others in an content of not more than 5,000 ppm, mostly less than 1,000 ppm. Boron, magnesium, manganese, cobalt, copper, sodium and zinc are in a particularly low content, such as not more than 500 ppm.

Total content of the impurities in the silicon carbide powder must be not more than 10% by weight.

(3) Nitrogen content

Generally, nitrogen is contained in the silicon carbide powder as an impurity. Commercially available silicon carbide powder mostly contains 500 ppm or more nitrogen.

The present inventors have found in tests of producing sintered silicon carbide-beryllium having a high thermal conductivity and a high electrical insulation that a sintered body having a larger volume has a remarkable drop in electrical insulation at the inside or interior side, which is caused by the presence of nitrogen in the sintered silicon carbide, as explained above. That is, when a nitrogen content of powdery silicon carbide composition exceeds 500 ppm, the electrical resistance at the inside or interior side of a sintered body drops, whereas, when the nitrogen content is not more than 500 ppm, a sintered body having a considerably high electrical resistance at the inside or interior side can be obtained, where an electric resistivity at the inside or interior side of a sintered body is normally $10^{12}$ $\Omega.cm$ or higher.

Aluminum and boron as the electron acceptor play an important role in a powdery silicon carbide-beryllium composition. When a nitrogen content is at least by 200 ppm more than the content of aluminum plus boron, the resistivity of sintered body is lowered. When the content of aluminum plus boron is at least by 350 ppm more than the nitrogen content, the resistivity of sintered body is also lowered. When a total content of aluminum, boron and nitrogen exceeds 0.5% by atom on the basis of the powdery composition, the thermal conductivity of sintered body is lowered.

In the present invention, a heat-decomposible organic compound, particularly silicone oil having siloxane bonds, can be used in the ordinary binder amount, that is, 1–10% by weight, on the basis of silicon carbide plus beryllium or its compound. It is presumed that silicone oil undergoes heat decomposition at about 1,000° C. to form $SiO_2$, carbon and methane, and at about 1,800° C. the $SiO_2$ reacts with C to form SiC and $CO_2$, and thus silicone oil is a preferable binder for producing sintered silicon carbide.

Sintered silicon carbide can be produced from the present powdery silicon carbide composition in the following manner: at first, fine silicon carbide powder and powder of beryllium or its compound are mixed in the presence of a heat-decomposible organic binder in the said proportion, and pre pressed at room temperature under a pressure of 1,000 kg/cm² to obtain a green body having a density of 1.60–1.67 g/cm². Then, the green body is sintered in a graphite die in vacuum, where the degree of vacuum is, for example, $1\times10^{-5}$–$1\times10^{-3}$ Torr, a sintering temperature is 1,850°–2,500° C., preferably 1,900°–2,300° C., and a sintering pressure is up to about 700 kg/cm², usually 100–300 kg/cm². The heating is carried out from room temperature to 1,850°–2,500° C. over 2 hours, and kept at 1,850°–2,500° C. at one hour, and then a heating electric source is turned off to leave the sintered body for cooling. The sintering pressure is released after the temperature is lowered to 1,500° C. or less.

The present invention will be described in detail below, referring to examples and drawings.

PREFERRED EMBODIMENTS OF THE INVENTION

A method for quantitative determination of nitrogen in a powdery silicon carbide composition used by the present inventors in the following examples will be described, and the nitrogen content referred to herein is the one thus determined.

It is not easy to measure a nitrogen content, because the method for measuring a nitrogen content has been established for metals, but not for ceramics yet. In the future another method will be developed to obtain more exact nitrogen content than the method as will be described below.

Figure 1:
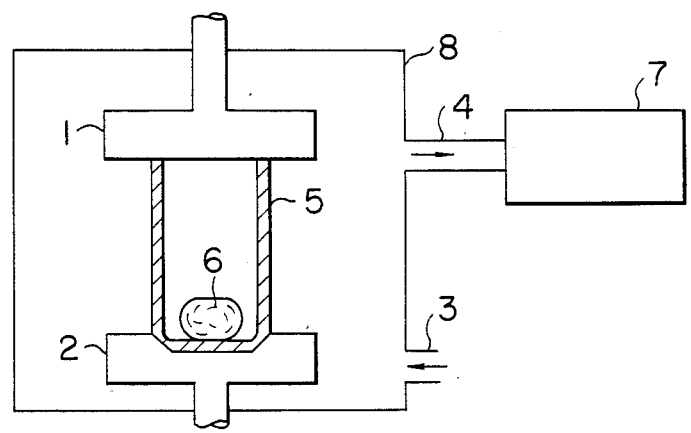
FIG. 1 is a schematic diagram illustrating a method for quantitative determination of nitrogen content in a powdery silicon carbide composition.

The method for quantitative determination of nitrogen used in the present invention is based on the well known gas chromatograph, where only a special procedure is used for extracting gases from silicon carbide powders. The extraction procedure uses nickel as a reactant or an extracting agent. The outline of the method and apparatus is shown in FIG. 1, where water-cooled copper electrodes 1 and 2 are provided in a vessel 8, and a graphite crucible 5 is provided between the electrodes 1 and 2. A mixture 6 of silicon carbide powders and nickel as an extracting agent is placed in the crucible 5 and the gas in the vessel 5 is thoroughly replaced with a helium gas. Then, the mixture 6 is heated by direct current passage (about 1,000 A) between the electrodes 1 and 2, whereby the crucible 5 reaches about 2,400°–2,500° C. The helium gas is led to the vessel 8 through a conduit 3 and withdrawn from a conduit 4 together with the extracted gas and led to a gas chromatographic analyser 7. Before analysis, the sample gas is passed through a filter to remove moisture and dusts therefrom.

According to one test, 20 mg of silicon carbide powders as a sample is enclosed in a nickel foil (20 mm×2 mm×0.1 mm thick) and placed in the crucible 5 together with the same additional weight of nickel as that of the nickel foil (total weight: about 700 mg). When the mixture 6 is heated in the crucible 5, nickel melts to cover the silicon carbide powders. Nickel melt permeates into between the silicon carbide powders and extracts gases (nitrogen, hydrogen, and oxygen) contained therein through reaction.

In this method, it is impossible to determine whether the gases contained in the silicon carbide powders have been 100% extracted or not, but no other reliable methods have been known yet than this method.

EXAMPLE 1

Silicon carbide powders (purity: 95%) having an average particle size of 2 μm and various contents of aluminum, boron and nitrogen were each admixed with 2% by weight of beryllium oxide (which corresponded to 0.74% by weight of beryllium atom) to prepare various powdery compositions. Then, each of the powdery compositions was admixed with 2% by weight of silicone oil as a binder on the basis of the powdery mixture, and kneaded. The kneaded mixture was prepressed at room temperature under a pressure of 1,000 kg/cm$^2$ to obtain a green body having a relative density of 50–53% on the basis of the theoretical density of the powdery mixture, for example, a green body having a density of 1.60–1.67 g/cm$^3$. Then, the green body was placed in a graphite die and sintered in vacuum ($1 \times 10^{-5}$–$1 \times 10^{-3}$ Torr) by hot pressing. The sintering pressure was 300 kg/cm$^2$, and heating from room temperature to 2,000° C. was carried out over 2 hours, while maintaining the prepressing at 2,000° C. for one hour. Then, a heating electric source was turned off to leave the prepressing for cooling. The sintering pressure was released after the temperature reached 1,500° C. or less. All of the thus obtained sintered bodies (70 mm in diameter and 1.5 mm thick) had a relative density of 98% or more on the basis of theoretical density of SiC, i.e. 3.21.

Figure 2:
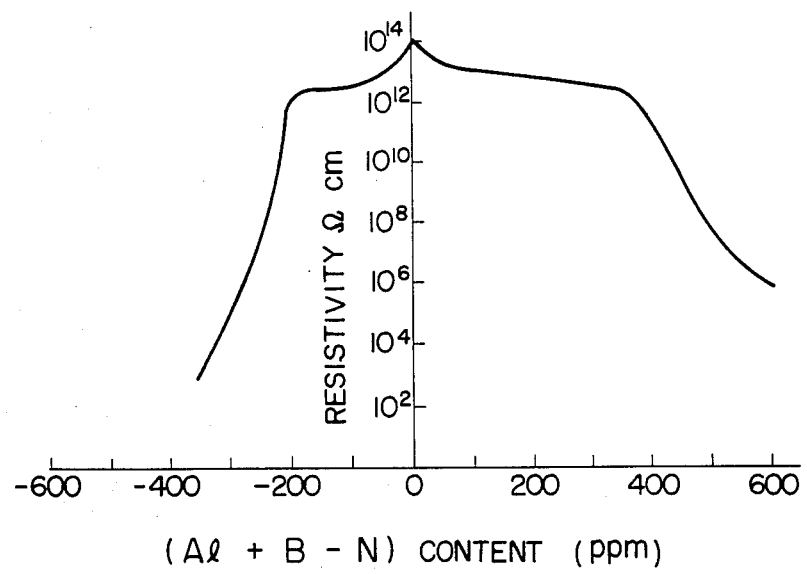
FIG. 2 is a diagram showing a relationship between a difference of total aluminum and boron content from nitrogen content in a powdery silicon carbide composition and a resistivity of sintered body produced from the composition.

A relationship between a difference of the aluminum and boron content from the nitrogen content in the powdery silicon carbide compositions used for producing the sintered bodies and an electrical resistivity of thus obtained sintered bodies is shown in FIG. 2. When the total amount of aluminum and boron was more than the nitrogen content and its difference was not more than 350 ppm, or when the nitrogen content was more than the total amount of aluminum and boron and its difference was not more than 200 ppm, the sintered bodies had a high resistivity of $10^{12}$ Ω.cm or more.

Figure 3A:
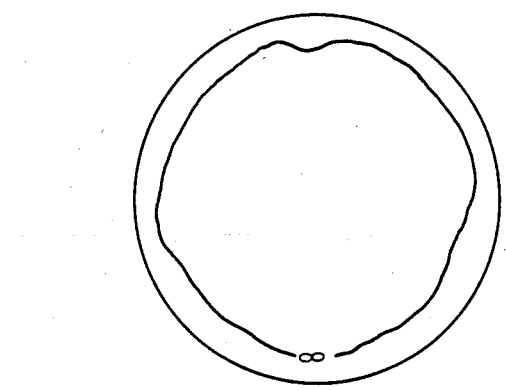
FIGS. 3A and 3B are diagrams of electric resistance distribution of sintered body produced from the present powdery silicon carbide composition and that of a comparative example, respectively.
Figure 3B:
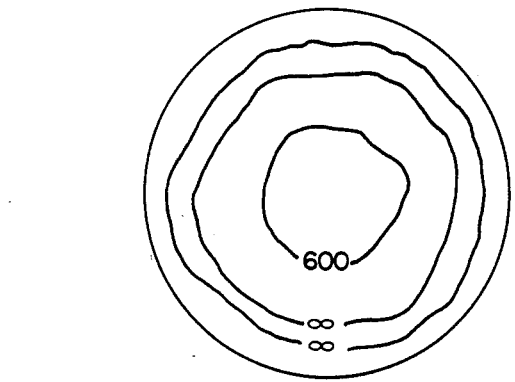
Figure 3B:
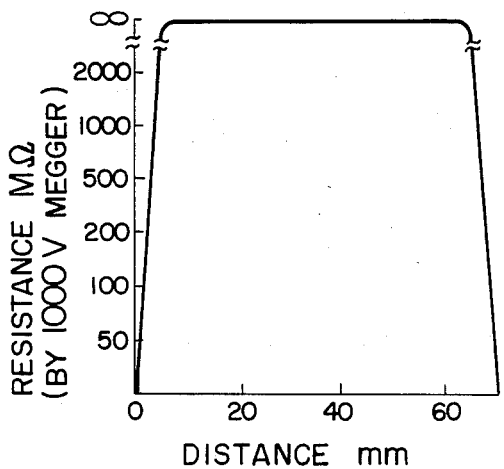
Figure 3B:
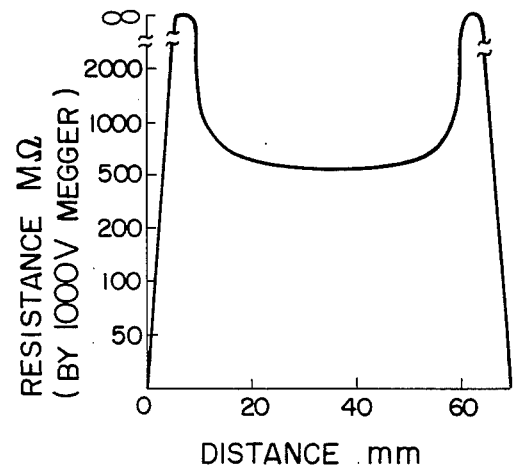
Figure 3C:
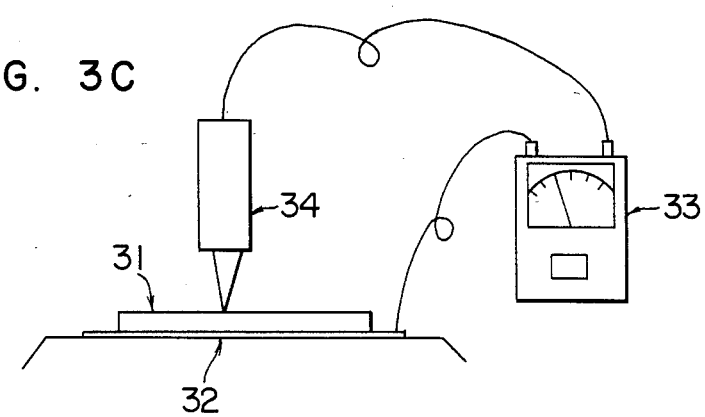
FIG. 3C is a diagram illustrating a method for measuring electric resistance in the determination used in FIGS. 3A and 3B.

Electric resistance distributions of a sintered body produced from a powdery silicon carbide composition having a nitrogen content of 200 ppm according to the present invention and that from the same powdery composition as above except for the nitrogen content, i.e. 600 ppm (comparative example) were measured by a simple detector, so-called 1,000 V megger, and their results are shown in FIGS. 3A and 3B, where the distance in diameter direction of the samples is shown on the abscissa and the electrical resistance on the ordinate. The method used in the above measurement is illustrated in FIG. 3C, where numeral 31 is a sintered body test piece, 32 an aluminum foil, 33 a 1,000 V megger (Type 3123, made by Yokogawa Electric Co., Japan), and 34 a probe. It is seen from these results that the sintered body from the present powdery composition has a high electrical resistance substantially throught the full range in the direction of diameter without any drop at the intermediate part, whereas a considerable drop in electrical resistance is seen at the intermediate part in the direction of diameter according to Comparative Example.

EXAMPLE 2

Figure 4:
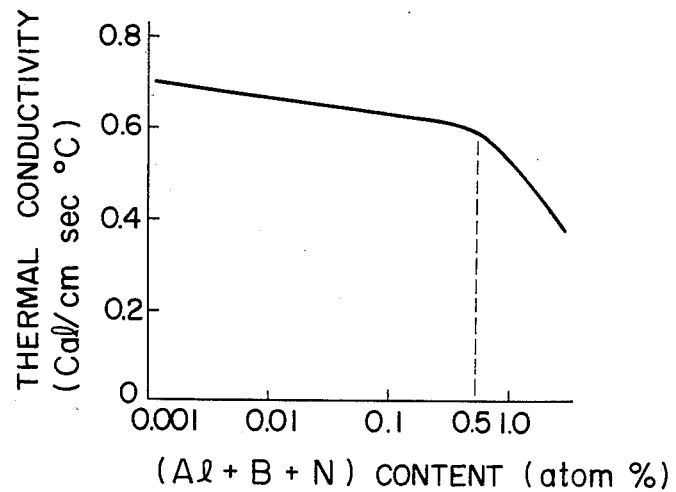
FIG. 4 is a diagram showing a relationship between the total aluminum, boron and nitrogen content in a powdery silicon carbide composition and the thermal conductivity of sintered body produced therefrom.

The same silicon carbide powders as used in Example 1 was admixed with aluminum oxide, boron oxide and silicon nitride in various proportions, and the resulting mixtures were each further admixed with 2% by weight of beryllium oxide on the basis of the thus obtained mixture to prepare silicon carbide compositions. Then, the silicon carbide compositions were prepressed and sintered in the same manner as in Example 1 to obtain various sintered bodies each having a relative density of 98% or more, as defined in Example 1. A relationship between a thermal conductivity of sintered bodies and a total content of aluminum and boron as electron acceptors and nitrogen is shown in FIG. 4, from which it is seen that, when the total content of aluminum, boron and nitrogen in powdery silicon carbide compositions exceeds 0.5% by atom, the thermal conductivity is decreased.

EXAMPLE 3

Figure 5:
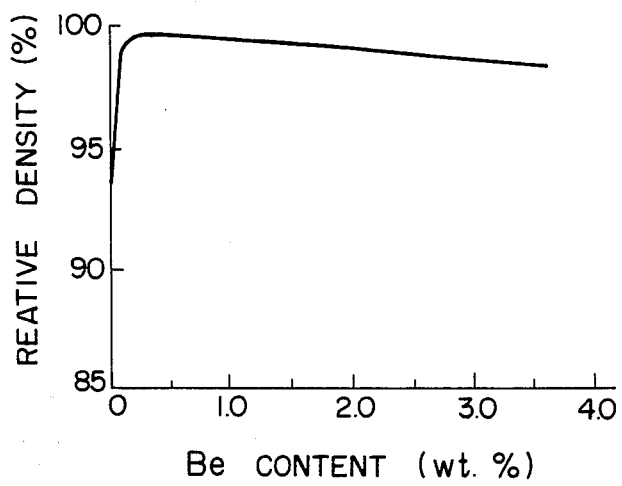
FIG. 5 is a diagram showing a relationship between a beryllium content in a powdery silicon carbide composition and a relative density of sintered body produced therefrom.
Figure 6:
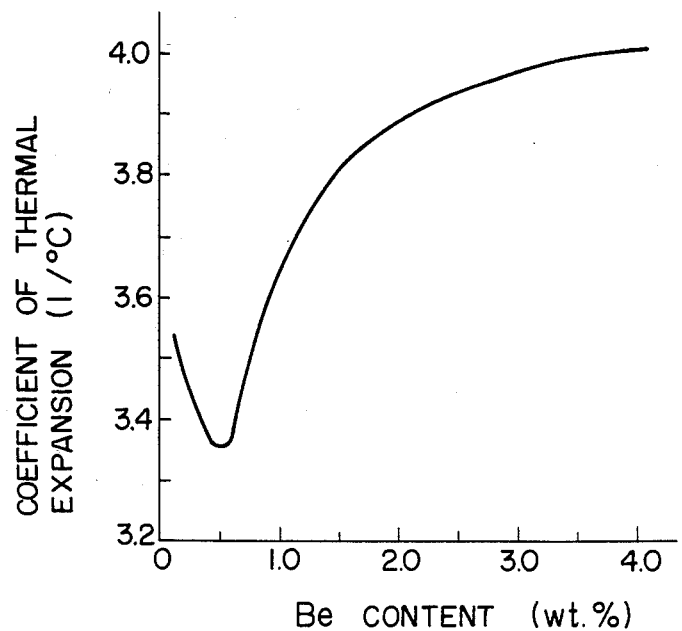
FIG. 6 is a diagram showing a relationship between a beryllium content in a powdery silicon carbide composition and a thermal expansion coefficient of sintered body produced therefrom.

Silicon carbide powders having a purity of 95% and containing 150 ppm Al, 30 ppm B and 80 ppm N was admixed with 0.01–10% by weight of beryllium oxide in terms of beryllium atom, and the resulting silicon carbide compositions were prepressed and sintered in the same manner as in Example 1 to obtain various sintered bodies. A relationship between a beryllium content in the powdery compositions and a relative density in the sintered bodies is shown in FIG. 5, and a relationship between a beryllium content in the compositions and a thermal expansion coefficient of the sintered bodies is shown in FIG. 6, from which it is seen that sintered silicon carbide bodies having a high density and a high thermal expansion coefficient such as $4 \times 10^{-6}/°C$. can be obtained with a beryllium content of 0.1–3.5% by weight.

EXAMPLE 4

Figure 7:
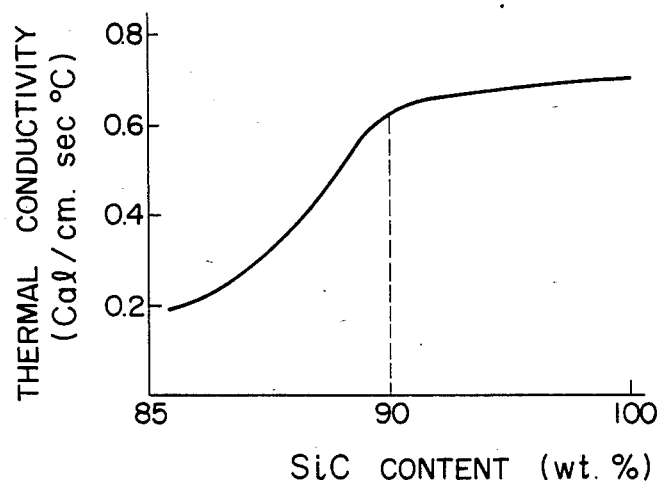
FIG. 7 is a diagram showing a relationship between a silicon carbide content in a powdery silicon carbide composition and a thermal conductivity of sintered body produced therefrom.

Silicon carbide powders having a purity of 95% and having 200 ppm Al, 55 ppm B and 100 ppm N were admixed with 2% by weight of beryllium oxide, and further with titanium oxide, vanadium oxide and iron oxide in various proportions to prepare silicon carbide compositions. Then, the silicon carbide compositions were prepressed and sintered in the same manner as in Example 1 to produce various sintered bodies. A relationship between a thermal conductivity of sintered bodies and a silicon carbide content of the powdery compositions is shown in FIG. 7, from which it is seen that sintered bodies having a high thermal conductivity are obtained with a silicon carbide content of 90% or more in the silicon carbide compositions.

EXAMPLE 5

Silicon carbide powders having an average particle size of 2 μm and different aluminum, boron and nitrogen contents as in Example 1 were admixed with 1.0% by weight of metallic beryllium powders having an average particle size of 20 μm, and the resulting powdery mixtures were shaped and sintered in the same manner as in Example 1.

The thus obtained sintered bodies had the same relationship between a resistivity of the sintered bodies and a difference of the total aluminum and boron content from the nitrogen content in the powdery silicon carbide compositions as shown in FIG. 2, i.e. they had a high resistivity of $10^{12}$ Ω.cm or more when the total aluminum and boron content was more than the nitrogen content and its difference was not more than 350 ppm or when the nitrogen content was more than the total aluminum and boron content and its difference was not more than 200 ppm.

EXAMPLE 6

Silicon carbide powders having an average particle size of 2 μm was admixed with 5% by weight of beryllium hydroxide, $Be(OH)_2$ in the same manner as in Example 1, and kneaded in the presence of a silicone oil binder to uniform granular powder sizes so as to facilitate the successive prepressing. Then, the resulting mixture was prepressed and sintered in the same manner as in Example 1. The thus obtained sintered bodies had the same relationship between the resistivity of sintered bodies and a difference of the total aluminum and boron content from the nitrogen content in the silicon carbide compositions as shown in FIG. 2.

EXAMPLE 7

Silicon carbide powders having an average particle size of 2 μm as used in Example 1 were admixed with 2.5% by weight of $Be_2C$ and the resulting mixture was prepressed and sintered in the same manner as in Example 1. The resulting sintered bodies had the same relationship between the resistivity of sintered body and a difference of the total aluminum and boron content from the nitrogen content in the silicon carbide compositions as shown in FIG. 2.

As described above, sintered silicon carbide having a high electrical insulation without any drop substantially throughout the sintered body and a high thermal conductivity can be produced from the present powdery silicon carbide composition and its green bodies.

What is claimed is:

1. A powdery silicon carbide composition for producing a sintered silicon carbide body which comprises at least 90% by weight of silicon carbide powders having an average particle size of not more than 10 μm, powders of beryllium or a compound thereof in an amount of 0.01 to 4% by weight in terms of beryllium, and aluminum, boron, and nitrogen; the powders of beryllium and a compound thereof having an average particle size of not more than 30 μm, the content of nitrogen in the composition being not more than 500 ppm and the difference between the total content of aluminum and boron and the content of the nitrogen in the powdery mixture ranging from −200 to +350 ppm.

2. A powdery silicon carbide composition according to claim 1, further comprising 10% by weight of a heat-decomposible organic binder on the basis of a total of the silicon carbide powder and the powder of beryllium or beryllium compound.

3. A powdery silicon carbide composition according to claim 1, wherein the composition is a compressed green body.

4. A sintered silicon carbide body obtained from a powdery silicon carbide composition of claims 2 or 1.

* * * * *